(12) United States Patent
Bienvenu et al.

(10) Patent No.: US 6,483,376 B1
(45) Date of Patent: Nov. 19, 2002

(54) VOLTAGE GENERATION CIRCUIT OF CHARGE PUMP TYPE, WITH A SELF-OSCILLATING CONTROL CIRCUIT

(75) Inventors: Philippe Bienvenu, Allauch; Antoine Pavlin, Puyricard, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/145,674

(22) Filed: Sep. 2, 1998

(30) Foreign Application Priority Data

Sep. 12, 1997 (FR) .............................. 97 11609

(51) Int. Cl.[7] ................................ G05F 1/10
(52) U.S. Cl. ........................ 327/536; 327/390
(58) Field of Search ................. 327/131, 135, 327/136, 137, 140, 536, 537, 538, 540, 390; 331/14, 17; 326/88

(56) References Cited

U.S. PATENT DOCUMENTS 5,097,226 A    3/1992  Pascucci et al. .............. 331/46
5,483,434 A  * 1/1996  Seesink ........................ 363/60
5,677,645 A  * 10/1997 Merritt ........................ 327/536
5,818,289 A  * 10/1998 Chevallier et al. .......... 327/536

FOREIGN PATENT DOCUMENTS

FR     A-2 692 415    12/1993    .......... H02M/3/156

* cited by examiner

*Primary Examiner*—Terry D. Cunningham
*Assistant Examiner*—Long Nguyen
(74) *Attorney, Agent, or Firm*—Wolf, Greenfield & Sacks, P.C.

(57) ABSTRACT

The present invention relates to a potential generation circuit of charge pump type, this circuit including at least two stages formed of capacitors and of circuitry for isolating or interconnecting the capacitors, to generate an output potential by charge transfer between the stages. The circuit is driven by two control potentials oscillating between a first and a second value. The circuit includes a self-oscillating control circuit to generate control potentials, to eliminate time delays between charge and discharge phases.

28 Claims, 3 Drawing Sheets

VOLTAGE GENERATION CIRCUIT OF CHARGE PUMP TYPE, WITH A SELF-OSCILLATING CONTROL CIRCUIT

BACKGROUND OF THE INVENTION

1. Field of the Invention

The present invention relates to the field of voltage generation circuits of the charge pump type. It applies in the field of circuits supplied by a voltage and in which it is necessary to generate a voltage higher than their supply voltage.

2. Discussion of the Related Art

Charge pump type circuits are typically used to supply capacitive type circuits, such as transistor gates. An application for these circuits is the provision of control potentials of power transistors used as switches. Another application is the provision of programming potentials to floating gate transistors, in electrically programmable memories.

FIG. 1 illustrates an example of a charge pump type generation circuit according to the state of the art. It supplies, on an output OP, a capacitive load represented by a capacitor Ceq. One pole of capacitor Ceq is connected to output OP and its other pole receives a reference potential Vss. The voltage across the capacitor is referred to as Vc.

An oscillator OSC, supplied by reference potential Vss and by a supply potential Vcc, provides a clock signal CK, illustrated in FIG. 2a. Signal CK is a logic signal, the potential of which oscillates between Vcc, in the high state, and Vss, in the low state. Signal CK is issued to the first pole of a capacitor C1, and to the input of a logic inverter G1. Capacitor C1 receives a precharge potential Vp on its second pole, via a diode D1. Potential Vp can be, for example, equal to potential Vcc. The anode of diode D1 receives potential Vp and its cathode is connected to the second pole of capacitor C1.

Inverter G1 generates a logic signal NCK, illustrated in FIG. 2b, by inverting signal CK. Signal NCK is provided to the first pole of a capacitor C2. The second pole of capacitor C2 is connected, on the one hand, to the cathode of a diode D2 and to the anode of a diode D3. The anode of diode D2 and the cathode of diode D3 are connected, respectively, to the second pole of capacitor C1 and to output OP.

It will be assumed that diodes D1, D2, and D3 induce an identical voltage drop Vd when they are forwardly conductive, and that Vcc>Vd and Vp>Vd. Assume that signal Ck is in the low state. Capacitor C1 receives potential Vss on its first pole and a potential Vp−Vd on its second pole. When signal CK switches to the high state, the potential of the second pole of capacitor C1 switches to value (Vp−Vd)+Vcc. A charge transfer to the second pole of capacitor C2 will then be performed, through diode D2. Diode D1 is then blocked and prevents the discharge of capacitor C1 to the node providing potential Vp. The potential of the second pole of capacitor C2 switches to value Vp+Vcc−2*Vd. The potential of the first pole of capacitor C2 is then equal to Vss. When signal CK switches back to the low state, diode D2 is blocked (non-conducting) and the potential of the second pole of capacitor C2 is increased. This potential then switches to (Vp+Vcc−2*Vd)+Vcc. By charge transfer through diode D3, voltage Vc will be progressively brought to value (Vp+2*Vcc)−3*Vd (assuming that Vss=0 volt). By using n stages, two successive stages respectively receiving signals CK and NCK, the potential generated by the voltage generation circuit can thus be brought to (Vp−Vd)+n*(Vcc−Vd).

An important feature of charge pump type circuits is the delay required for the output potential to reach the desired value. It is generally attempted to obtain very short delays (also called rise times). In practice, the rise time can be shown to be inversely proportional to the value of the capacitors used. The use of capacitors of high values indeed enables transfer, in each cycle, of a greater number of charges to the output, which decreases the rise time. However, the increase of the capacitor values can raise a problem of implementation and/or of bulk, in integrated circuits.

SUMMARY OF THE INVENTION

An aim of the present invention is to provide an improved circuit which, for an equal rise time, decreases the capacitor values.

For this purpose, it is provided to generate the control signals via a self-oscillating control circuit. Time phases during which the potentials of the control signals are stable are thus eliminated, these time phases corresponding to the end of charge and discharge phases of the capacitors of the voltage generation circuit.

Thus, the present invention provides a potential generation circuit of charge pump type, this circuit including at least two stages formed of capacitors and of means for isolating or interconnecting the capacitors, to generate an output potential by charge transfer between the stages. The circuit is driven by at least two control potentials, the capacitors receiving one of the control potentials on a first pole. The two control potentials oscillate between a first and a second value so that they control, on the one hand, a charge phase of the capacitors when they switch from the first value to the second value and, on the other hand, a discharge phase of the capacitors when they switch from the second value to the first value. The circuit includes a self-oscillating control circuit to generate, on outputs, the control potentials, the control circuit receiving the control potentials on inputs and being arranged so that these control potentials be modified as soon as they reach the first or the second value.

According to an embodiment, the control circuit includes a comparator for comparing the control potentials with a reference potential to modify the values of the control potentials according to the result of the comparison.

According to an embodiment, the reference potential corresponds to the first value of the control potentials.

According to an embodiment, the control circuit includes an RS flip-flop at the output of the comparator, to guarantee that the control potentials do not overlap.

According to an embodiment, the comparator receives the control potentials on inverting inputs and the flip-flop is of NAND type.

According to an embodiment, the control potentials are generated by buffer circuits driven by outputs of the flip-flop.

According to an embodiment, the control potentials are generated by buffer circuits driven by outputs of the comparator.

According to an embodiment, the buffer circuits are inverters.

The foregoing objects, features and advantages of the present invention, will be discussed in detail in the following non-limiting description of specific embodiments in connection with the accompanying drawings.

DETAILED DESCRIPTION

Figure 3:
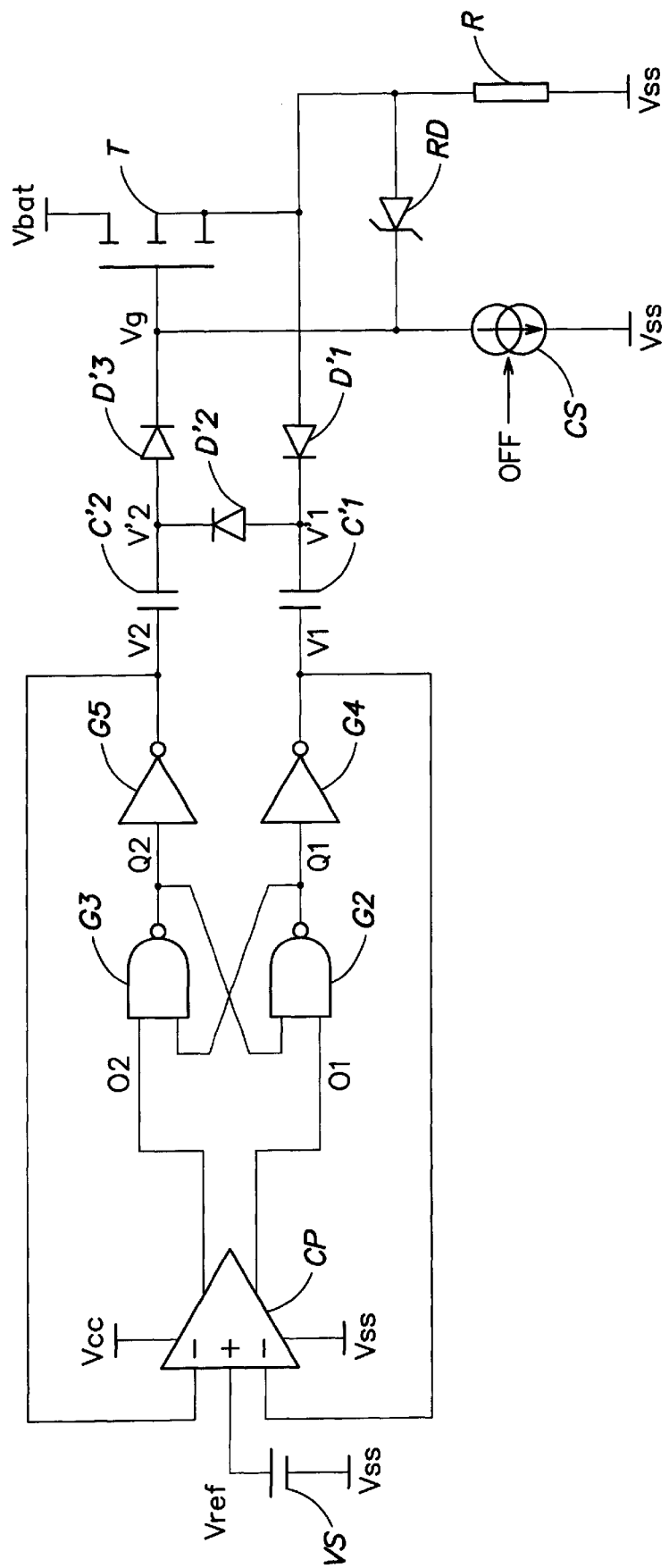
FIG. 3 shows a circuit implementing the present invention.

FIG. 3 illustrates a circuit implementing the present invention. As an example, the control of a VDMOS-type N-channel power transistor T, used as a switch, will be considered. Transistor T is used to connect a load to a supply source providing a potential Vbat, which can, for example, come from a battery, or isolate it from this source. The load, represented by a resistor R, can for example be an electric motor. The drain of transistor T receives potential Vbat. Its source is connected to a first pole of resistor R, which receives a low reference potential Vss, lower than Vbat, on its second pole. It will be assumed that Vss=0 volt.

The control gate of transistor T receives a control potential Vg which controls the on or off state of this transistor. To turn on transistor T, a potential Vg higher than Vtr is issued, Vtr being the threshold voltage of transistor T. To turn off this transistor, a potential Vg lower than Vtr, for example, Vss, is provided. In the example illustrated in FIG. 3, the control gate of transistor T can be represented by the equivalent gate-source capacitor of this transistor.

The circuit illustrated in FIG. 3 includes a voltage generation circuit of charge pump type, this voltage generation circuit providing potential Vg.

Figure 1:
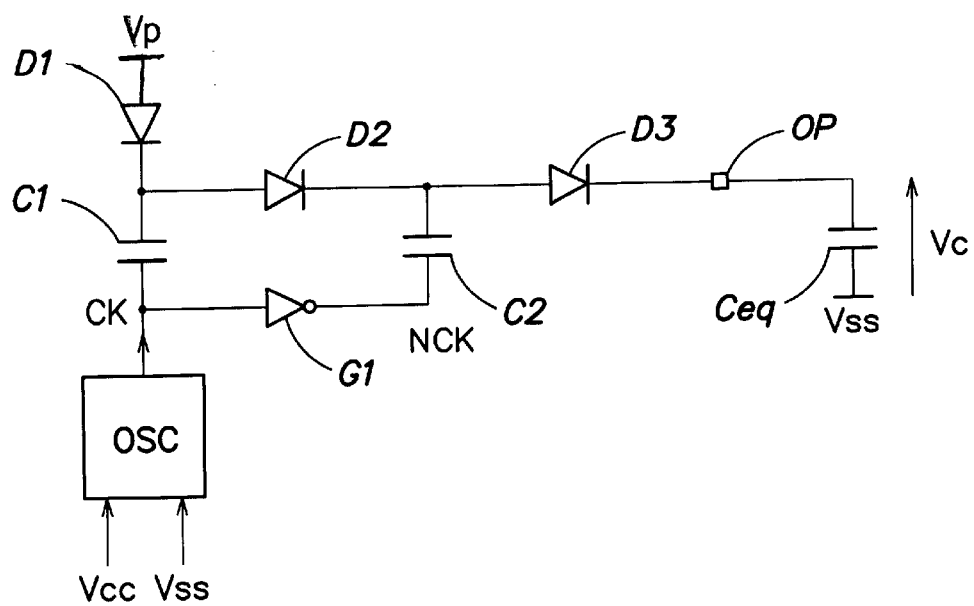
FIG. 1 illustrates a circuit of charge pump type according to the state of the art.
Figure 2A:
FIGS. 2a and 2b illustrate control signals used in the circuit of FIG. 1.
Figure 2B:
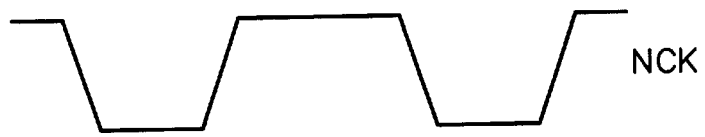

As in the example illustrated in FIG. 1, a two-stage circuit, that is, including two capacitors to provide potential Vg and means enabling to isolate or interconnect the capacitors will be considered.

A first capacitor C'1 has a first pole connected to the source of transistor T, via a diode D'1. The second pole of capacitor C'1 receives a first control potential VI. The anode and the cathode of diode D'1 are connected, respectively, to the source of transistor T and to the first pole of capacitor C'1. The potential present on the first pole of capacitor C'1 will be referred to as V'1.

A second capacitor C'2 has a first pole connected to the first pole of capacitor C'1, via a diode D'2. The second pole of capacitor C'1 receives a second control potential V2. The anode and the cathode of diode D'2 are connected, respectively, to the first pole of capacitor C'1 and to the first pole of capacitor C'2. The first pole of capacitor C'2 is also connected to the anode of a diode D'3. The cathode of this diode D'3 is connected to the gate of transistor T and provides potential Vg. The potential present on the first pole of capacitor C'2 will be referred to as V'2.

To generate control potentials V1 and V2, a self-oscillating control circuit including a comparator CP, an RS-type flip-flop and buffer circuits is used. It will be assumed that these circuits are supplied by a high supply potential Vcc and by reference potential Vss.

Control potentials V1 and V2 drive the charge transfer in the stages of the voltage generation circuit. As will be seen, the control potentials oscillate between a first and a second value. When these potentials switch from the first value to the second value, they control a charge phase of the capacitors. When they switch from the second value to the first one, they control a discharge phase of the capacitors. The control circuit retroactively receives the control potentials, so that the control potentials are modified as soon as they reach the first or the second value.

Comparator CP includes three inputs. A non-inverting input "+" receives a reference potential Vref, lower than Vcc, provided by a voltage source VS. This voltage source can, for example, be a bandgap type circuit which provides a relatively accurate and temperature-stable reference potential. A first and a second inverting input "−" receive, respectively, potential V1 and potential V2. As will be seen hereafter, the comparator is used to compare the control potentials with reference potential Vref and to modify the values of these control potentials according to the result of the comparison.

Comparator CP provides two output potentials O1 and O2. The values of these output potentials are representative of the comparison of the values of potentials V1 and V2 with the value of Vref. If V1>Vref, then, O1=Vss, this potential being representative of a low logic state. If V1<Vref, then O1=Vcc this potential being representative of a high logic state. Similarly, if V2>Vref, then O2=Vss, and if V2<Vref, then O2=Vcc.

Figure 4:
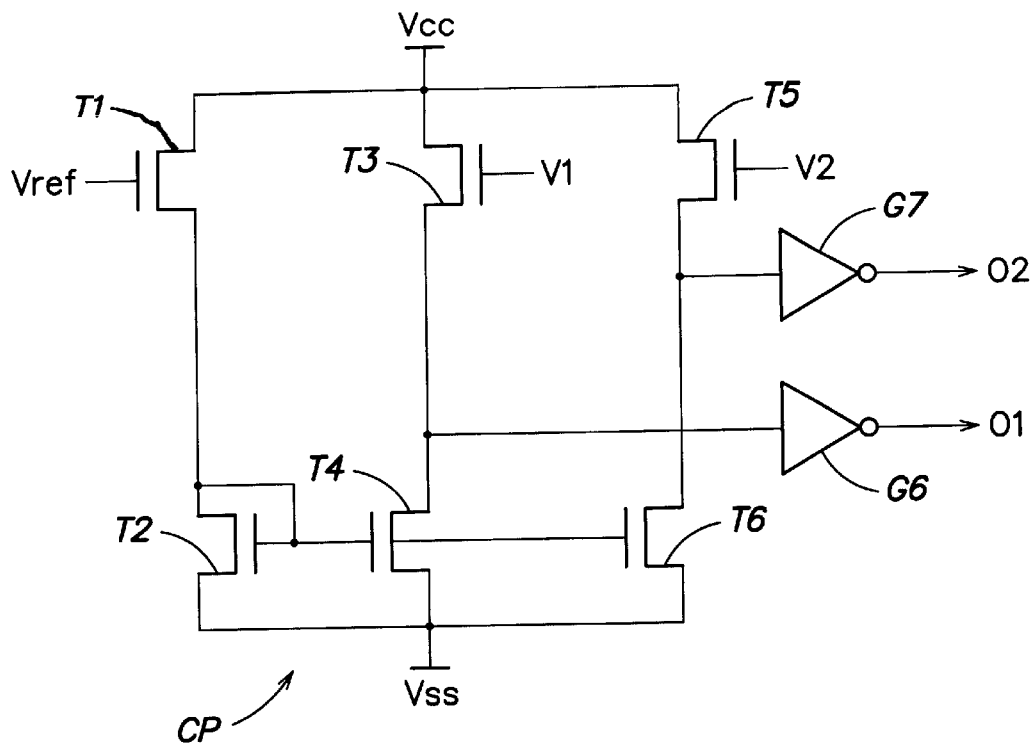
FIG. 4 shows a three-input comparator used in the circuit of FIG. 3, and FIGS. 5a and 5b illustrate potentials of control of the circuit of FIG. 3.

FIG. 4 illustrates an example of an embodiment of comparator CP. It includes three branches, each branch being formed of two N-channel MOS-type transistors.

A first branch includes a first and a second transistor T1 and T2. Transistor T1 receives, respectively, potentials Vcc and Vref on its drain and on its control gate. Its source is connected to the drain of transistor T2. Transistor T2 is connected as a reference current source and its control gate is connected to its drain. The source of transistor T2 receives potential Vss.

A second branch includes a first and a second transistor T3 and T4. Transistor T4 receives, respectively, potentials Vcc and V1 on its drain and on its control gate. Its source is connected to the drain of transistor T4. The control gate of transistor T4 is connected to the control gate of transistor T2 and these transistors form a current mirror. The source of transistor T4 receives potential Vss. An inverter G6, including an input connected to the drain of transistor T4 and an output, issues potential O1 on its output. It will be assumed that this inverter is supplied by potentials Vcc and Vss.

A third branch includes a first and a second transistor T5 and T6. Transistor T5 receives, respectively, potentials Vcc and V2 on its drain and on its control gate. Its source is connected to the drain of transistor T6. The control gate of transistor T6 is connected to the control gate of transistor T2 and these transistors form a current mirror. The source of transistor T6 receives potential Vss. An inverter G7, including an input connected to the drain of transistor T6 and an output, provides potential O2 on its output. It will be assumed that this inverter is supplied by potentials Vcc and Vss.

If, for example, potential V1 is higher than potential Vref, transistor T3 tends to become more conductive than transistor T1. Since the current through transistor T4 is imposed by transistor T2, the potential on the drain of transistor T4 will increase to reach a value close to Vcc. Thereby, potential O1 will decrease to reach a value close to Vss.

If, conversely, potential V1 is lower than potential Vref, then transistor T3 is less conductive than transistor T1. The drain potential of transistor T4 will then tend to decrease to reach a value close to Vss, and potential O1 will tend to increase to reach a value close to Vcc.

The same occurs for potentials V2 and O2.

Two distinct comparators could of course be used to provide potentials O1 and O2. The example illustrated in FIG. 4 has the advantage of reducing or minimizing the surface occupied by the voltage generation circuit.

The RS flip-flop is of NAND type. It is thus responsive to falling edges received on its inputs. This flip-flop is formed of two NAND-type logic gates G2 and G3, having two inputs and one output. Gate G2 receives potential O1 on a first input. It generates a potential Q1 on its output. Gate G3 receives potential O2 on a first input and potential Q1 on a second input. It generates a potential Q2 on its output. Finally, gate G2 receives potential Q2 on a second input.

In the example illustrated, the buffer circuits are formed of inverters G4 and G5 having one input and one output. These inverters receive, respectively, potentials Q1 and Q2. They provide on their outputs, respectively, control potentials V1 and V2. Buffer circuits enabling to provide high currents to the second poles of the capacitors will be chosen, to reduce or minimize the rise and fall times of potentials V1 and V2.

Inverters G4 and G5 may, possibly, be directly connected to the outputs of comparator CP. The use of the RS flip-flop guarantees that the control potentials do not overlap. The maximum value of one or the other of the control potentials corresponds, in time, to the minimum value of the other potential. A maximum excursion of the potential difference across the capacitors is thus guaranteed. This RS flip-flop also avoids problems of blocking the oscillations of the control potentials, at low supply voltage.

Figure 5A:
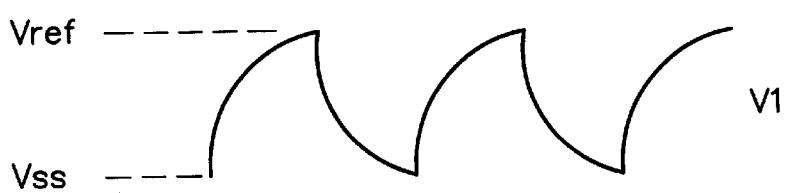
Figure 5B:
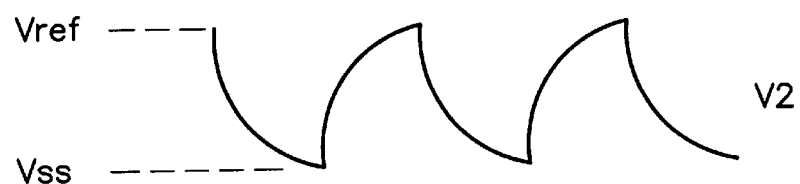

The operation of the voltage generation circuit will be described. The voltage drop in the channel of transistor T in the on state is referred to as Vtr and the voltage drops, assumed to be identical, in diodes D'1, D'2, and D'3 when forward biased are referred to as Vd. It is further assumed that Vcc>Vref>Vd. FIGS. 5a and 5b illustrate control potentials V1 and V2.

It is assumed that transistor T is initially off. The value of potential Vg has to be increased for this transistor to turn on. For this purpose, potential Vss will be used as a precharge potential of capacitor C'1, assuming that potential V'1 is substantially equal to potential Vss.

It is further assumed that control potential V1 is slightly lower than Vref and is decreasing and that potential V2 is lower than Vref and is increasing. Thus, Q2=Vss, Q1=Vcc, O1=Vcc, and O2=Vcc.

Since potential V1 is decreasing, a negative potential difference will be created across capacitor C'1. Diode D'1 will turn on and capacitor C'1 is charged through diode D'1 and resistor R.

When V2 reaches value Vref, potential O2 switches from Vcc to Vss. Accordingly, potential Q2 rises to reach Vcc. When the switching threshold of inverter G5 is reached, control potential V2 is modified and switches to Vss. This modification of potential V2 causes a rise to Vcc of signal O2, as soon as potential V2 becomes lower than Vref. Concurrently to the modification of potential V2 and since O1=Vcc, the rise of potential Q2 induces a modification of potential Q1 which drops to reach Vss. Thereby, control potential V1 increases to reach Vref. The potential of the second pole of capacitor C'1 will thus be increased by a maximum value Vref−Vss=Vref. Thereby, potential V'1 increases to reach Vref.

As soon as the increase of potential V'1 is higher than Vd, diode D'2 is forward biased and charges are transferred from the first capacitor C'1 to the second capacitor C'2. Diode D'1 is then blocked (becomes non-conducting).

When potential V1 reaches value Vref, potential O1 drops to reach Vss. A modification of potential Q1, which rises to reach Vcc, then occurs. Potential V1 will then decrease toward Vss. Diode D'2 will then block (become non-conducting).

The modification of potential Q1 concurrently results in a modification of potential Q2, which will drop to reach Vss. An increase in control potential V2, which will reach Vref, then occurs. Potential V'2 will thus increase to reach a maximum value 2*Vref−Vd. As soon as the potential difference becomes higher than Vd across diode D'3, this diode becomes conductive and charges are transferred to the control gate of transistor T. The equivalent gate-source capacitor of transistor T will thus charge. It is enough to have 2*Vref−Vd>Vtr for transistor T to turn on.

When potential V2 has reached its maximum value Vref, a new charge transfer will be performed from the first capacitor to the second capacitor, and so on.

As soon as transistor T turns on, potential V'1 will vary between Vbat−(Vtr+Vd) and (Vbat+Vref)−(Vtr+Vd). Potential V'2 will vary between (Vbat+Vref)−(Vtr+2*Vd) and (Vbat+2*Vref)−(Vtr+2*Vd). Finally, potential Vg will reach value (Vbat+2*Vref)−(Vtr+3*Vd).

The voltage generation circuit according to the present invention enables, for an equal capacitor value, to obtain a shorter rise time. Indeed, no control signals of clock signal type are provided, since the latter comprise successive phases during which the potentials are stabilized to fixed values. Now, the charge transfer between capacitors is actually performed upon modifications of the control potentials. The stabilizing of these potentials thus corresponds to the end of the charge transfer phases.

In the present invention, as soon as a charge transfer phase has ended, the next phase is started. Since the charge and discharge phases are not interrupted, the number of charge transfers performed in a given delay is increased or maximized. Thus, for an equal rise time, capacitors of lower capacitance and less bulk may be used.

A potential Vref close to Vcc will preferably be chosen. Indeed, since the number of transferred charges is proportional to the potential difference across the capacitors, the number of loads transferred in a transfer will be greater as this potential difference is higher. Further, the value of the potential Vg generated will be higher as the value of potential Vref is higher.

The voltage generation circuit includes elements for turning off transistor T and for regulating the value of potential Vg.

To turn off transistor T, a logically-controlled current source CS is used. This source discharges the gate of transistor T and to bring the value of -this potential back to a value close to the value of potential Vss. This current source receives a logic control signal OFF and is arranged so that the gate of transistor T discharges when the signal is in a first state, and that this source is blocked when the signal is in a second state.

A zener diode RD is used to regulate potential Vg. The anode and the cathode of this diode are respectively connected to the gate and to the source of transistor T. This diode enables to limit the value of potential Vg to the absolute value of the avalanche voltage of this diode.

Another system of regulation of voltage Vg may be used, for example, by stopping the generation of the control potentials when the value of potential Vg reaches a given threshold.

Of course, the present invention is likely to have various alterations, modifications, and improvements which will readily occur to those skilled in the art. The type of logic gates used may be modified, while maintaining a comparable functionality. The diodes could also, for example, be replaced with diode-connected transistors. A circuit having four control signals may also be implemented, by replacing the diodes with transistors receiving two control potentials raised with respect to control potentials V1 and V2.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A potential generation circuit of charge pump type, this circuit including at least two stages formed of capacitors and of means having a first operating state for isolating the capacitors of said stages and a second operating state for interconnecting the capacitors of said stages, to generate an output potential by charge transfer between the stages, the circuit being driven by at least two control potentials, each of the capacitors receiving a respective one of the control potentials on a first pole, the two control potentials oscillating between a first value and a second value so that they control, on the one hand, a charge phase of the capacitors when they switch from the first value to the second value and, on the other hand, a discharge phase of the capacitors when they switch from the second value to the first value, the circuit including a self-oscillating control circuit to generate, on outputs, the control potentials, the control circuit receiving the control potentials on inputs and being arranged so that these control potentials be modified when they reach the first or the second value.

2. The circuit of claim 1, wherein the control circuit includes a comparator for comparing the control potentials with a reference potential to modify the values of the control potentials according to the result of the comparison.

3. The circuit of claim 2, wherein the reference potential corresponds to the first value of the control potentials.

4. The circuit of claim 2, wherein the control circuit includes an RS flip-flop at the output of the comparator, to guarantee that the control potentials do not overlap.

5. The circuit of claim 4, wherein the comparator receives the control potentials on inverting inputs and the flip-flop includes NAND gates.

6. The circuit of claim 4, wherein the control potentials are generated by buffer circuits driven by outputs of the flip-flop.

7. The circuit of claim 2, wherein the control potentials are generated by buffer circuits driven by outputs of the comparator.

8. The circuit of claim 6, wherein the buffer circuits are inverters.

9. The potential generation circuit of claim 1 wherein the control circuit is further arranged so that the control potentials are modified as soon as they reach the first value and as soon as they reach the second value.

10. The circuit of claim 9, wherein the control circuit includes a comparator for comparing the control potentials with a reference potential to modify the values of the control potentials according to the result of the comparison.

11. The circuit of claim 10, wherein the reference potential corresponds to the first value of the control potentials.

12. The circuit of claim 10, wherein the control circuit includes an RS flip-flop at the output of the comparator, to guarantee that the control potentials do not overlap.

13. The circuit of claim 12, wherein the comparator receives the control potentials on inverting inputs and the flip-flop includes NAND gates.

14. The circuit of claim 12, wherein the control potentials are generated by buffer circuits driven by outputs of the flip-flop.

15. The circuit of claim 10, wherein the control potentials are generated by buffer circuits driven by outputs of the comparator.

16. The circuit of claim 14, wherein the buffer circuits are inverters.

17. A potential generation circuit of charge pump type, this circuit including at least two stages formed of capacitors and of means for isolating or interconnecting the capacitors of said stages, to generate an output potential by charge transfer between the stages, the circuit being driven by at least two control potentials, each of the capacitors receiving a respective one of the control potentials on a first pole, the two control potentials oscillating between a first value and a second value so that they control, on the one hand, a charge phase of the capacitors when they switch from the first value to the second value and, on the other hand, a discharge phase of the capacitors when they switch from the second value to the first value, the circuit including a self-oscillating control circuit to generate, on outputs, the control potentials, the control circuit receiving the control potentials on inputs and being arranged so that these control potentials be modified when they reach the first or the second value; and wherein the control circuit includes a comparator for comparing the control potentials with a reference potential to modify the values of the control potentials according to the result of the comparison, and the control circuit includes an RS flip-flop at the output of the comparator, to guarantee that the control potentials do not overlap.

18. The circuit of claim 17, wherein the comparator receives the control potentials on inverting inputs and the flip-flop includes NAND gates.

19. The circuit of claim 17, wherein the control potentials are generated by buffer circuits driven by outputs of the flip-flop.

20. The circuit of claim 19, wherein the buffer circuits are inverters.

21. A potential generation circuit of charge pump type, this circuit including at least two stages formed of capacitors and of means for isolating or interconnecting the capacitors of said stages, to generate an output potential by charge transfer between the stages, the circuit being driven by at least two control potentials, each of the capacitors receiving a respective one of the control potentials on a first pole, the two control potentials oscillating between a first value and a second value so that they control, on the one hand, a charge phase of the capacitors when they switch from the first value to the second value and, on the other hand, a discharge phase of the capacitors when they switch from the second value to the first value, the circuit including a self-oscillating control circuit to generate, on outputs, the control potentials, the control circuit receiving the control potentials on inputs and being arranged so that these control potentials be modified when they reach the first or the second value, and wherein the control circuit includes a comparator for comparing the control potentials with a reference potential received at an input of the comparator.

22. The circuit of claim 21, wherein the control circuit includes a comparator for comparing the control potentials with a reference potential to modify the values of the control potentials according to the result of the comparison.

23. The circuit of claim 22, wherein the reference potential corresponds to the first value of the control potentials.

24. The circuit of claim 22, wherein the control circuit includes an RS flip-flop at the output of the comparator, to guarantee that the control potentials do not overlap.

25. The circuit of claim 24, wherein the comparator receives the control potentials on inverting inputs and the flip-flop includes NAND gates.

26. The circuit of claim 24, wherein the control potentials are generated by buffer circuits driven by outputs of the flip-flop.

27. The circuit of claim 22, wherein the control potentials are generated by buffer circuits driven by outputs of the comparator.

28. The circuit of claim 26, wherein the buffer circuits are inverters.

* * * * *